United States Patent [19]

Meikle

[11] Patent Number: 5,795,495
[45] Date of Patent: Aug. 18, 1998

[54] METHOD OF CHEMICAL MECHANICAL POLISHING FOR DIELECTRIC LAYERS

[75] Inventor: Scott G. Meikle, Boise, Id.

[73] Assignee: Micron Technology, Inc., Boise, Id.

[21] Appl. No.: 526,001

[22] Filed: Sep. 8, 1995

Related U.S. Application Data

[63] Continuation-in-part of Ser. No. 232,610, Apr. 25, 1994, Pat. No. 5,449,314.

[51] Int. Cl.$^6$ .................................................... H01L 21/311
[52] U.S. Cl. ............................ 216/88; 216/38; 216/51; 156/626.1; 156/628.1; 156/636.1; 156/657.1; 437/228; 451/41
[58] Field of Search ...................... 156/626.1, 636.1, 156/657.1, 628.1; 437/228, 238, 225, 974; 451/29–31, 41; 216/88, 89, 38, 51

[56] References Cited

U.S. PATENT DOCUMENTS

| | | | |
|---|---|---|---|
| Re. 34,400 | 10/1993 | Goto et al. | 437/67 |
| 3,841,031 | 10/1974 | Walsh | 51/283 |
| 4,030,943 | 6/1977 | Lee et al. | 437/36 |
| 4,509,249 | 4/1985 | Goto et al. | 29/576 W |
| 4,545,852 | 10/1985 | Barton | 156/643.1 |
| 4,680,893 | 7/1987 | Cronkhite et al. | 51/5 R |
| 4,980,306 | 12/1990 | Shimbo | 437/34 |
| 5,036,015 | 7/1991 | Sandhu et al. | 156/626.1 |
| 5,064,683 | 11/1991 | Poon et al. | 427/39 |
| 5,104,482 | 4/1992 | Monkowski et al. | 156/643.1 |
| 5,137,597 | 8/1992 | Curry, II et al. | 156/636 |
| 5,142,828 | 9/1992 | Curry, II | 51/281 R |
| 5,169,491 | 12/1992 | Doan | 156/636.1 |
| 5,200,351 | 4/1993 | Hadjizadeh-Amini | 437/238 |

(List continued on next page.)

FOREIGN PATENT DOCUMENTS

| | | |
|---|---|---|
| 602607A1 | 6/1994 | European Pat. Off. |
| 63-266830 | 11/1988 | Japan ........................ 216/88 |

OTHER PUBLICATIONS

"Rodel Products Corp.," *Surfacetech Review* 1 (1), Dec. 1986.

Heyboer et al., "Chemomechanical Silicon Polish," *J. Electrochem. Soc.* 138(3): 774–777, Mar. 1991.

Patrick et al., "Application of Chemical Mechanical Polishing to the Fabrication of a VLSI Circuit Interconnections," *J. Electrochem. Soc.* 138(6): 1778–1784, Jun. 1991.

Yu et al., "Submicron Aluminum Plug Process Utilizing High Temperature Sputtering and Chemical Mechanical Polishing," *Conference Proceedings ULSI-VII, Materials Res. Soc.*, 519–524, 1992.

Wolf, "Silicon Processing for the VSLI ERA," *Process Integration* vol. 2, pp. 198–239, Lattice Press.

*Primary Examiner*—R. Bruce Breneman
*Assistant Examiner*—Anita Alanko
*Attorney, Agent, or Firm*—Seed and Berry LLP

[57] ABSTRACT

A method of forming a planarized dielectric layer includes depositing a dielectric material on a substrate with a dopant concentration that decreases with depth and then chemically mechanically polishing the doped dielectric material. During the chemical mechanical polishing process the polish rate will be relatively fast initially but will slow down as the lighter doped material is contacted. Global planarity and polish selectivity are improved because the dopant gradient will automatically slow down the polish rate in areas where the lighter doped material is contacted. The high points of the dielectric material will thus polish faster than the low points. In an alternate embodiment of the invention, an underlying layer is deposited below a dopant graded dielectric layer having a predetermined dopant concentration that decreases with depth. The underlying layer may be undoped or uniformly doped. During the chemical mechanical planarization process, the dielectric layer with the graded profile is substantially removed. This insures that subsequent process steps will not be affected by a planarized dielectric layer having a non-uniform dopant concentration.

12 Claims, 4 Drawing Sheets

U.S. PATENT DOCUMENTS

| | | | |
|---|---|---|---|
| 5,230,184 | 7/1993 | Bukhman | 51/283 R |
| 5,272,117 | 12/1993 | Roth et al. | 437/228 |
| 5,300,463 | 4/1994 | Cathey et al. | 437/238 |
| 5,302,233 | 4/1994 | Kim et al. | 156/636 |
| 5,312,512 | 5/1994 | Allmun et al. | 156/636 |
| 5,314,843 | 5/1994 | Yu et al. | 437/974 |
| 5,332,467 | 7/1994 | Sune et al. | 156/636.1 |
| 5,356,513 | 10/1994 | Burke et al. | 156/636.1 |
| 5,387,540 | 2/1995 | Poon et al. | 437/67 |
| 5,399,233 | 3/1995 | Murazumi et al. | 156/635 |
| 5,424,240 | 6/1995 | Han | 437/67 |
| 5,492,858 | 2/1996 | Bose et al. | 437/67 |
| 5,494,854 | 2/1996 | Jain | 437/228 |
| 5,502,007 | 3/1996 | Murase | 437/228 |
| 5,516,729 | 5/1996 | Dawson et al. | 156/636.1 |
| 5,560,802 | 10/1996 | Chisholm | 156/636.1 |
| 5,629,242 | 5/1997 | Nagashima et al. | 216/88 |

METHOD OF CHEMICAL MECHANICAL POLISHING FOR DIELECTRIC LAYERS

CROSS-REFERENCE TO RELATED APPLICATIONS

This is a continuation in part of application Ser. No. 08/232,610, filed on Apr. 25, 1994, and entitled "Method of Chemical Mechanical Polishing for Dielectric Layers," now U.S. Pat. No. 5,449,314.

TECHNICAL FIELD

This invention relates to semiconductor manufacture, and more particularly to an improved method of chemical mechanical polishing for forming planarized dielectric layers.

BACKGROUND OF THE INVENTION

One technique that is used in semiconductor manufacture for planarizing dielectric layers is chemical mechanical polishing (planarizing) or (CMP). Chemical mechanical polishing involves holding and rotating a semiconductor wafer against a wetted polishing platen under controlled chemical, pressure and temperature conditions. Typically a slurry solution is used as the abrasive fluid. The polishing mechanism is a combination of mechanical action and the chemical reaction of the material being polished with the slurry solution.

As circuit densities increase, chemical mechanical polishing has become one of the most viable techniques for planarization particularly for interlevel dielectric layers. In view of this, improved methods of chemical mechanical polishing are being increasingly sought. One aspect of chemical mechanical polishing in need of improvement is the speed and throughput of the process for semiconductor manufacture. In general, CMP is a relatively slow and time consuming process. During the polishing process semiconductor wafers must be individually loaded into a carrier, polished and then unloaded from the carrier. The polishing step in particular is very time consuming and may require several minutes.

Recently, different techniques have been used in the art for increasing the speed and throughput of the CMP process. As an example, more aggressive slurry solutions have been developed to increase the speed of the polishing step. Higher carrier downforces and faster surface velocities for the polishing platen are also sometimes used. Although these techniques are somewhat successful, they may adversely effect the polishing process and the uniformity of the polished surface.

Another aspect of the CMP process in need of improvement is the ability to polish the dielectric layer to a uniform planarity across the surface of the wafer. The CMP process may not proceed uniformly across the wafer for several reasons, some of which are: (1) the difference in relative velocity between the surface of the wafer and the polishing pad from the center of the wafer to its edge; (2) the difference in slurry distribution and flow rate across the surface of the wafer; (3) any variance in the composition of the dielectric layer across the wafer; (4) the degree of non-uniformity of the topography of the wafer; and (5) the face of the wafer may not be parallel with the surface of the platen throughout the CMP process. Accordingly, the polishing rate of a dielectric layer may vary from one region of the wafer to another, causing variances in the planarity of the surface of the resulting dielectric layer. This problem may be compounded by aggressive solutions, higher carrier downforces and increased surface velocities.

Endpoint detection is one technique that is used to enhance the uniformity of the surface of the polished dielectric layer. One desirable endpoint detection technique involves depositing a layer of dielectric material with a relatively low polishing rate over the substrate and any features that are fabricated on the substrate. When the features are conducting lines, for example, the dielectric material is deposited in a relatively thick layer that covers the conducting lines and completely fills the spaces in between the conducting lines. A second layer of dielectric material with a relatively high polishing rate is subsequently deposited on top of the first layer and polished until at least a portion of the first layer is exposed. Since the first layer is relatively thick and completely fills the space between the conducting lines when it is deposited, the space between the conducting lines is completely filled with only the material of the first dielectric layer even after the CMP process is completed.

Although the endpoint detection technique described above is generally desirable, it is not well suited for forming dielectric layers directly over conducting lines because it makes it difficult to subsequently fabricate other features in between the conducting lines. By completely filling the spaces between the conducting lines with the same material, another type of feature may be fabricated in these spaces only after the dielectric layer is etched by precisely locating the spaces between the conducting lines, depositing a resist over the dielectric layer, photo-patterning the resist, etching the material in the spaces, and removing the resist. Accordingly, it would be desirable to develop an endpointing technique that forms a uniformly planar dielectric layer that is easily etched to fabricate features in the spaces between the conducting lines.

In view of these and other problems of prior art CMP processes, there is a need in the art for improved methods of CMP. In addition, there is a need in the art for improved methods of forming and planarizing dielectric layers. Accordingly, it is an object of the present invention to provide an improved method of CMP and an improved method of forming and planarizing dielectric layers using CMP. It is a further object of the present invention to provide an improved method of CMP that is suitable for large scale semiconductor manufacture and in which increased process speeds and throughput are obtained without sacrificing global planarity. It is a further object of the present invention to provide an improved method of forming and planarizing dielectric layers in which the dielectric layer can be formed with a uniform composition and global planarity using CMP.

These and other objects, advantages and capabilities of the present invention will become more apparent as the description proceeds.

SUMMARY OF THE INVENTION

In accordance with the present invention an improved method of chemical mechanical polishing and for forming and planarizing dielectric layers is provided. The method generally stated, comprises doping a dielectric layer with a dopant having a predetermined concentration profile. The dopant concentration is highest near the surface of the dielectric layer and decreases with the depth into the dielectric layer. In general, a highly doped material will polish faster than a lighter doped material. By setting the dopant concentration highest at the surface of the dielectric layer the outlying material will polish more easily and the initial polish rate will be relatively fast. As the polishing process continues the polish rate will fall as the lighter doped material is contacted. The overall polish time is reduced, however, because of the faster initial polish rate. Global uniformity is improved because the dopant gradient automatically slows down the polish rate in areas where the lighter doped material has been reached. This allows the polishing process to catch up in some areas and slow down in others and helps to provide a global uniformity to the planarized surface. In other words, the high points are polished faster than low points and the selectivity of the polishing process is improved.

Suitable dopants include boron, phosphorus, arsenic and germanium. The dopant is deposited in a precise concentration profile using techniques that are known in the art such as the simultaneous chemical vapor deposition of a deposition species with a dopant species. Boron and phosphorus are preferred dopants because they allow increased planarity in a polished dielectric layer and do not easily form corrosive byproducts.

In an alternate embodiment of the invention for achieving an undoped or uniformly doped dielectric layer, the dielectric layer may be initially deposited in two portions. A lower portion of the dielectric layer, closest to the substrate, may be undoped or formed with a uniform dopant concentration. An upper portion of the dielectric layer, closest to the surface to be planarized, may be formed with a graded dopant profile as previously described. In one example of this embodiment, the lower portion of the dielectric layer is made from silicon nitride. The silicon nitride layer may have a substantially uniform thickness across the surface of the wafer that provides a polishing stop on top of the features that are formed on the substrate. During CMP most of the upper portion of the dielectric layer will be removed leaving a planarized dielectric layer that is undoped or has a substantially uniform dopant concentration. This insures that subsequent process steps, such as via formation, will not be affected by a non-uniform dopant concentration.

In a further example of the invention, a first dielectric layer is deposited on the conducting lines so that the first layer forms indentations between adjacent conducting lines, and a second dielectric layer is deposited on top of the first layer so that the second layer fills the indentations. The first layer has a relatively low polishing rate, and the second layer has a higher polishing rate than the first layer. After the first and second layers are deposited, the second layer is polished using a CMP process and the process is end-pointed at a planar endpoint located within the first layer.

DETAILED DESCRIPTION OF THE INVENTION

As used herein the term "concentration profile" refers to the distribution of a dopant in a dielectric layer as a function of depth. The term "polish rate" refers to the rate of material removal during chemical mechanical polishing of a dielectric layer. The term "polish selectivity" refers to the ratio of the rate of polishing high points versus the rate of polishing low points on a dielectric layer. In general, a high "polish selectivity," wherein high points are removed faster than the low points, is a desirable situation.

The chemical mechanical polishing processes mentioned in this application can be carried out using apparatus that are known in the art. One suitable apparatus is manufactured by Westech Engineering and is designated as a Model 372 Polisher. Other suitable apparatus are described in U.S. Pat. Nos. 5,036,015; 3,841,031; and 5,142,828 which are incorporated herein by reference.

Figure 1:
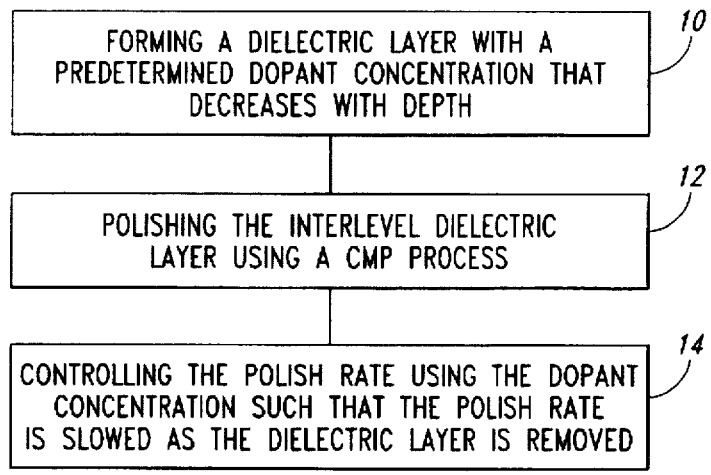
FIG. 1 is a flow diagram outlining the steps involved in the chemical mechanical polishing of a dielectric layer in accordance with the invention.

With reference to FIG. 1, the method of the invention broadly stated, includes the steps of:

forming a dielectric layer with a predetermined dopant concentration that decreases with depth, step 10;

polishing the dielectric layer using a CMP process, step 12; and controlling the polish rate using the dopant concentration such that the polish rate is slowed as the dielectric layer is removed, step 14.

Figure 3A:
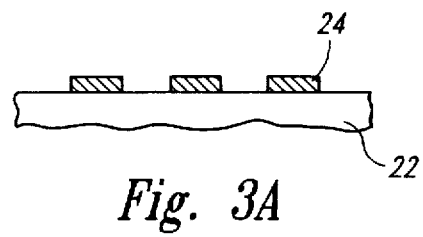
FIGS. 3A–3C are schematic cross sectional views of a semiconductor structure illustrating the method of the invention as outlined in FIG. 1.
Figure 3B:
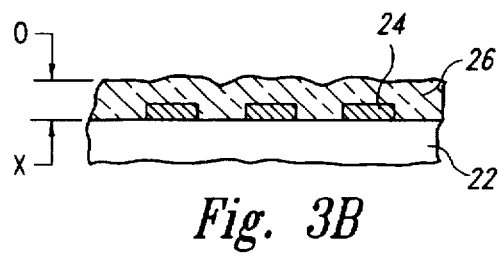
Figure 3C:
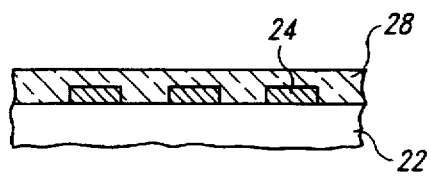

This process is illustrated schematically in FIGS. 3A–3C. FIG. 3A shows a substrate oxide 22 on which parallel spaced conducting lines 24 have been formed. As an example, the substrate oxide 22 may be silicon dioxide (SiO$_2$) formed on a silicon substrate (not shown). The conducting lines 24 may be aluminum or another conductive material.

In FIG. 3B, a dielectric layer 26 has been deposited over the conducting lines 24 and on the substrate 22. The dielectric layer 26 may be silicon dioxide or another dielectric material such as fluorine containing silicon dioxide. In order to facilitate subsequent processing the dielectric layer 26 requires planarization.

In accordance with the method of the invention the dielectric layer 26 is doped with a predetermined concentration profile to control the polish rate during the CMP process. Suitable dopants include boron, phosphorus, arsenic and germanium. The concentration profile of the dopant is controlled such that the concentration of the dopant is highest near the surface and lowest near the interface of the dielectric layer 26 and the substrate oxide 22. In other words the concentration of the dopant decreases as the depth increases.

Figure 4:
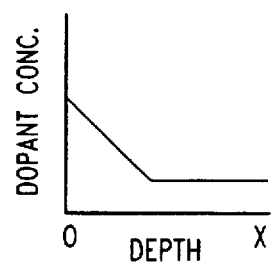
FIG. 4 is a graph plotting dopant concentration vs. depth for the dielectric layer shown in FIG. 3A.

This is shown graphically in FIG. 4. At a depth of zero, at the surface of the dielectric layer 26, the dopant concentration of the dielectric layer 26 is high. The dopant concentration then drops in a substantially linear manner and then levels off at a relatively low level. At a depth of x, at the interface of the dielectric layer 26 and the substrate oxide 22, the dopant concentration is relatively low. Representative ranges of dopant concentration are from 2% to 5% near the surface of the dielectric layer 26 and from 0% to 2% near the interface of the dielectric layer 26 with the substrate oxide 22.

In general, a dielectric material having a relatively high concentration of a dopant will have a higher polish rate during CMP than the same material having a relatively low concentration of the dopant. The polish rate of the dielectric layer 26 thus decreases with depth. Stated differently, the polish rate will be relatively high near the original surface but will slow down as more material is removed. In a similar manner the high points of the dielectric layer 26 will polish faster than the low points because the high points have a higher dopant concentration. Polish selectivity will thus be high. This concentration profile for the dopant is selected to achieve a desired polish rate at each depth.

A predetermined concentration profile of dopant atoms may be obtained using deposition and diffusion procedures that are known in the art. As an example, a chemical vapor deposition process may be used to simultaneously deposit a dopant species and a deposition species and form a doped layer of material. For example, a capacitively coupled RF plasma deposition system using source gases for the deposition species such as $SiH_4$, $O_2$, $N_2O$, TEOS, or $O_3$ can be used to deposit a layer of $SiO_2$. The $SiO_2$ can be doped during deposition using source gases for the dopant species such as $B_2H_6$ or $PH_3$. The $SiO_2$ layer would typically be deposited at 300°–400° C. at pressures ranging from 1.0 to 500 Torr. During the deposition process the relative concentrations of the source gases for the deposition species and dopant species may be controlled to achieve a predetermined concentration profile for the dopant.

Figure 2:
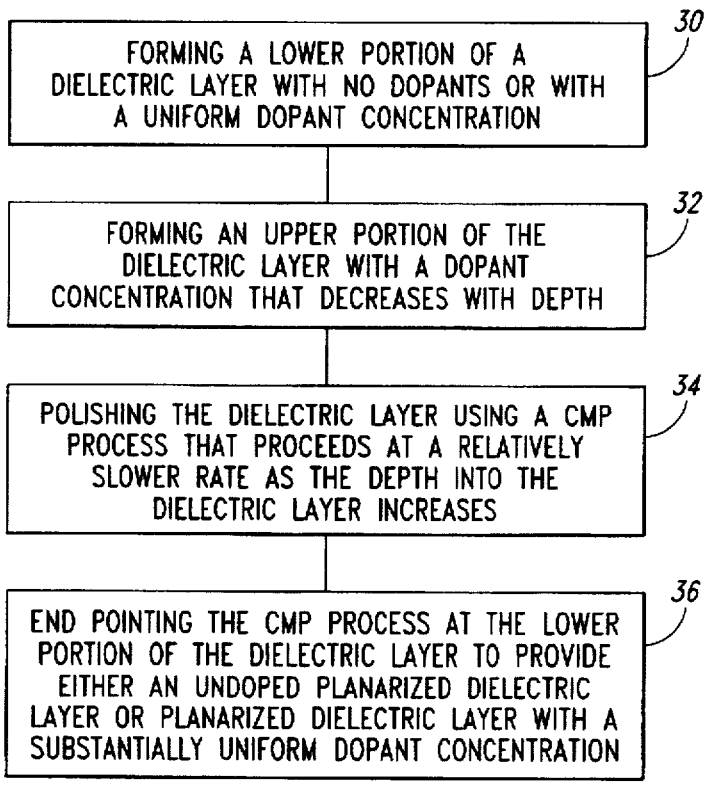
FIG. 2 is a flow diagram outlining the steps involved in the chemical mechanical polishing of a dielectric layer in accordance with an alternate embodiment of the invention for providing an undoped or uniformly doped planarized dielectric layer.

For providing a planarized dielectric layer with no dopants, or with a uniform dopant concentration, an alternate embodiment of the invention is outlined in FIG. 2. The alternate embodiment includes the steps of:

forming a lower portion of a dielectric layer with no dopants or with a uniform dopant concentration, step 30;

forming an upper portion of the dielectric layer with a dopant concentration that decreases with depth, step 32;

polishing the dielectric layer using a CMP process that proceeds at a relatively slower rate as the depth into the dielectric layer increases, step 34; and end pointing the CMP process within the lower portion of the dielectric layer to provide either an undoped planarized dielectric layer or planarized dielectric layer with a substantially uniform dopant concentration, step 36.

Figure 5A:
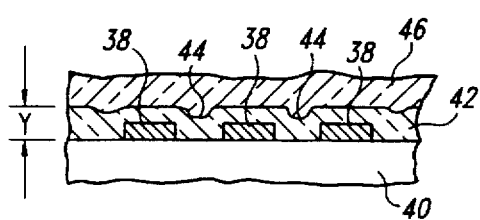
FIGS. 5A–5B are schematic cross sectional views of a semiconductor structure illustrating the alternate embodiment of the invention as outlined in FIG. 2.

With reference to FIG. 5A, a substrate oxide 40 includes an array of parallel spaced conducting lines 38. In accordance with the invention, a lower dielectric layer 42 is deposited over the conducting lines 38 and on the substrate oxide 40. The lower dielectric layer 42 is undoped or may be doped with a dopant at a uniform concentration. The lower dielectric layer 42 includes indentations 44 that form during the deposition process and correspond to the spaces between the conducting lines 38. The indentations 44 form as a result of the lower dielectric layer 46 conforming to the topography of the conducting lines 38.

Following deposition of the lower dielectric layer 42, an upper dielectric layer 46 is deposited on the lower dielectric layer 42. The upper dielectric layer 46 is doped with a dopant having a concentration that decreases with depth. The upper dielectric layer 46 is thus similar to the dielectric layer 26 previously described (FIG. 3B).

Figure 5B:
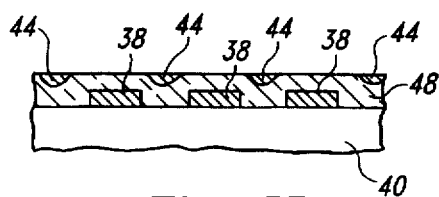

Next as shown in FIG. 5B, a CMP process is performed to form a planarized dielectric layer 48. During the CMP process, the upper dielectric layer 46 is polished substantially as previously described for dielectric layer 26. Initially the polish rate through the upper dielectric layer 46 will be relatively fast because the high dopant concentration near the surface forms a layer of material that is relatively easy to polish. As the polishing process continues, however, and more material is removed, the polish rate slows down as the lighter doped material is contacted. At the same time, the high points will polish faster than the low points and polish selectivity will be high.

The polishing process, as well as the initial thickness "y" of the lower dielectric layer 42 (FIG. 5A), can be controlled such that the planar endpoint of the planarized dielectric layer 48 falls within the lower dielectric layer 42. The planarized dielectric layer 48 therefore, with the exception of the indentations 44, is entirely formed of the lower dielectric layer 42. The planarized dielectric layer 48 will therefore be undoped or have a substantially uniform dopant concentration depending on how the lower dielectric layer 42 was formed. This insures that subsequent process steps, such as via formation, are not effected by a non uniform dopant concentration.

Although either boron, phosphorus, arsenic, or germanium can be used as a dopant in the method of the invention, boron is preferred. In general, the topography and polish selectivity of a boron doped dielectric during CMP is more favorable than that of a phosphorus or arsenic doped dielectric. The wafer will therefore planarize globally at a substantially uniform rate with boron as a dopant.

In another example of the invention shown by FIGS. 5A and 5B, the lower dielectric layer of 42 may be made from undoped silicon nitride (SiN). Compared to silicon dioxide, silicon nitride is harder and less reactive to the chemicals in most of the common CMP slurries. Silicon nitride accordingly has a significantly lower polishing rate than that of silicon dioxide because its hardness reduces the mechanical effects of the CMP process and its lower reactivity reduces the chemical effects of the CMP process. As a result, when the lower layer 42 is made from silicon nitride, the high points on the wafer made from doped silicon dioxide are removed significantly faster than any low points made from silicon nitride. The lower dielectric layer 42 may be deposited to form a layer of silicon nitride that has a uniform thickness across the surface of the substrate 40.

In operation, the polishing process continues at a relatively rapid rate through the upper dielectric layer 46 because, as discussed above, the high dopant concentration near the surface of layer 46 makes this layer relatively easy to polish. The lower dielectric layer 42 will initially be exposed under the regions of the upper dielectric layer 46 that are removed the fastest. Yet, only a small amount of the material on the surface of the exposed regions of the lower layer 42 is removed by the CMP process because the lower layer has a much lower polishing rate than the upper layer 46. The removal process continues until the upper dielectric layer 46 is removed to the level of the upper surfaces of the lower dielectric layer 42. Since the polishing rate of silicon nitride is so much lower than that of doped or undoped silicon dioxide, the overall polishing rate drops significantly once the layer of silicon nitride is uniformly exposed across the wafer. Thus, when the silicon nitride layer has a constant thickness across the wafer, it acts as a polishing stop that forms a highly planar dielectric layer.

EXAMPLE 1

In order to compare the polish rates of dielectric oxides with different dopants and dopant concentrations, plasma deposited silicon dioxide ($SiO_2$) samples were CMPed under similar conditions.

The SiO2 deposition conditions were as follows:
Pressure=5–10 Torr
$SiH_4$/TEOS flow rate ratio=1:1
Power=300–500 W
$B_2H_6$ flow rate=20–50 sccm
$PH_3$ flow rate=20–50 sccm
The CMP process condition were as follows:
Pressure=5–7 psi
Pad/wafer velocity=100 cm/s
Colloidal silica slurry
The following data was obtained.

TABLE 1

|  | Undoped | 1% Phos. | 3% Phos. | 3% Boron |
| --- | --- | --- | --- | --- |
| Polish Rate (Å/sec) | 51.0 | 61.4 | 84.8 | 70.4 |

As can be seen, the polish rate with a doped oxide is higher than with an undoped oxide. In addition the polish rate increases with the concentration of a dopant.

Experiment 2

In this experiment the polishing selectivity as a function of polish time was determined for an undoped control sample and compared to a 3% boron doped sample and to a 3% phosphorus doped sample. Polish selectivity was measured by comparing the polish rate in high areas (i.e., the array) to the polish rate in the low areas (i.e., the scribe). The array consisted of aluminum interconnects. Table 2 summarizes the dielectric deposition conditions.

TABLE 2

| Array | Composition |
| --- | --- |
| Control | 20K Å of undoped silicon dioxide |
| Phosphorus | 14K Å of undoped silicon dioxide + 6K Å of 3% phosphorus doped |
| Boron | 14K Å of undoped silicon dioxide + 6K Å of 3% boron doped |

Figure 6:
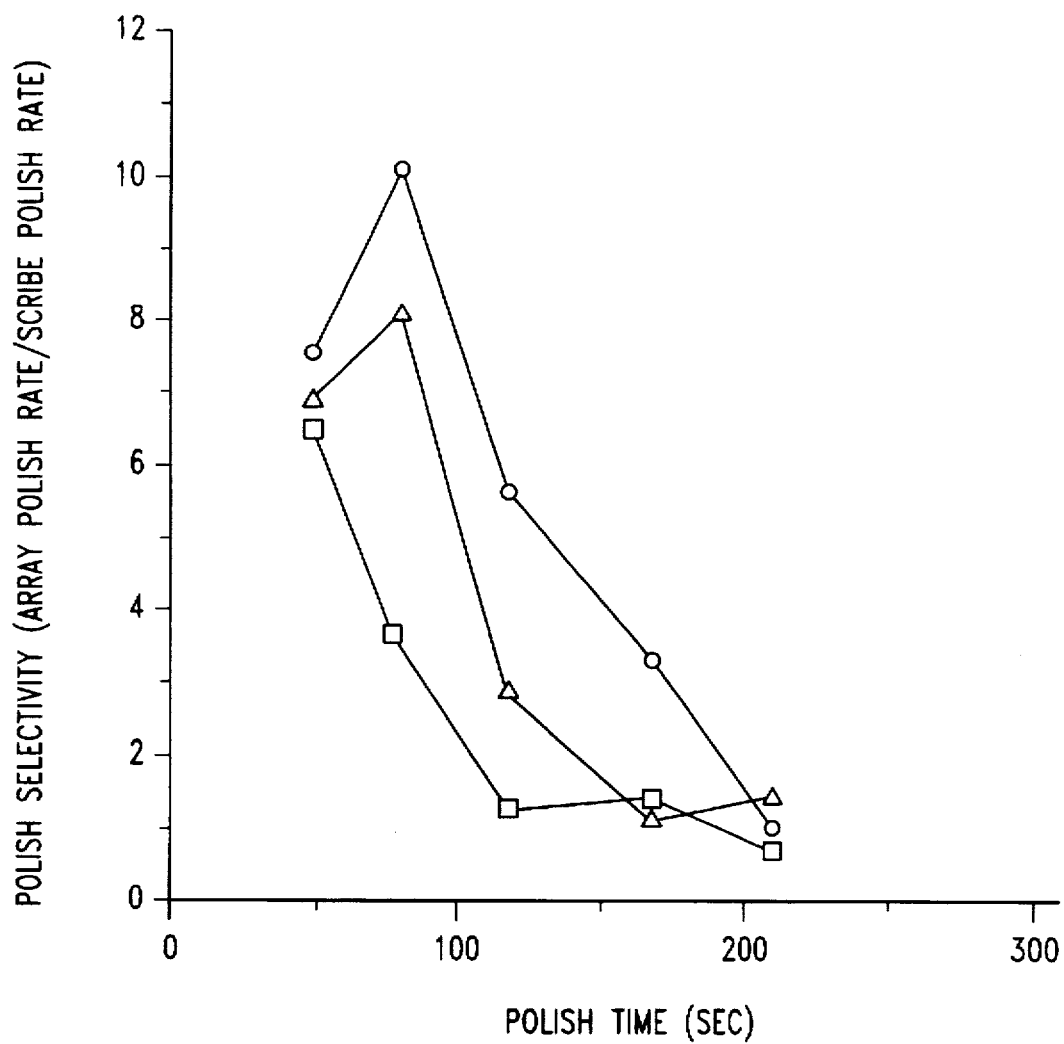
FIG. 6 is a graph plotting polish selectivity vs. polish time for a control sample and for samples formed with boron and phosphorus doped dielectric layers.

The results of this experiment are summarized in FIG. 6. The curve plotted with circular points is the control sample, the curved with triangular points is the 3% phosphorus doped sample, and the curve plotted with square points is the 3% boron doped sample.

The sample array with 3% boron doped oxide has a polish selectivity similar to that of the control array. This helps to provide a globally planarized surface. From this data it was concluded that boron doping allows high polish rates without a loss in polish selectivity. The 3% phosphorus doped oxide sample, on the other hand, has a significantly reduced polish selectivity indicating global planarization characteristics that are not as favorable as boron.

Experiment 3

In this experiment a sample was formed in accordance with the alternate embodiment of the invention outlined in FIG. 2 and shown in FIGS. 5A–5B. The purpose of the experiment was to demonstrate the planarization of an undoped dielectric layer suitable for the formation of vias. The upper dielectric layer (46 FIG. 5A) was formed of phosphorus doped silicon dioxide having a dopant concentration that decreased with depth. The lower dielectric layer (42 FIG. 5A) was formed of undoped silicon dioxide. This stack was deposited on metal conducting lines (38 FIG. 5B) and then CMPed in accordance with the method of the invention.

Figure 7:
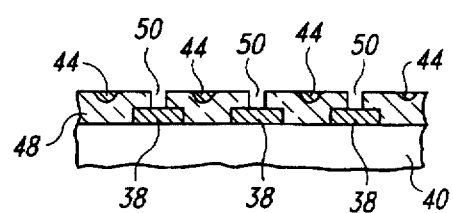
FIG. 7 is a schematic cross sectional view of a semiconductor structure having a dielectric layer planarized in accordance with the invention and showing the formation of vias through the planarized dielectric layer.

Next, as illustrated in FIG. 7, vias 50 were etched through the planarized dielectric layer 48 and to the conducting lines 38. Photomicrographs of the resultant structure illustrated that the planarized dielectric layer 48 in the area of the vias 50 was undoped. It was concluded that this method insures that via formation was not affected by a non-uniform dopant concentration.

Figure 8A:
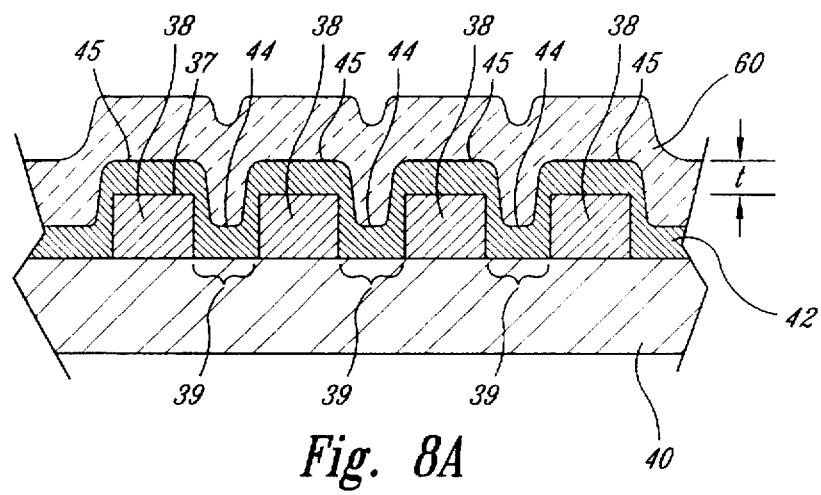
FIG. 8A is a schematic cross-sectional view of a semiconductor structure illustrating an embodiment of the invention.
Figure 8B:
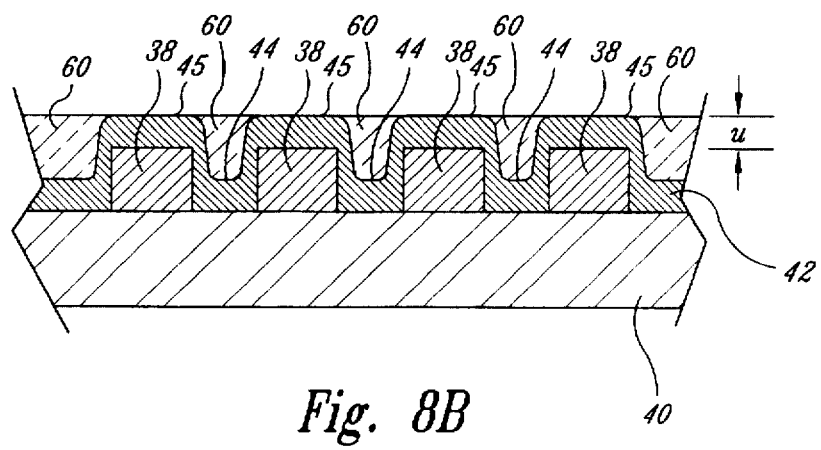
FIG. 8B is another cross-sectional view of the semiconductor structure of the embodiment of the invention of FIG. 8A.

FIGS. 8A and 8B illustrate another embodiment of the invention that is particularly useful for forming a highly planar layer of dielectric material over an array of conducting lines. Like reference numbers in FIGS. 8A and 8B refer to like components in FIGS. 5A and 5B.

FIG. 8A shows an array of parallel, spaced apart conducting lines 38 on a substrate oxide 40. The spaces between the conducting lines 38 form a number of channels 39 in which other features are desirably fabricated in subsequent processes. The conducting lines 38 are representative of only one type of feature on the substrate 40 that can be covered with a layer of dielectric material. Other features, such as transistors, memory blocks or film stacks of various components, may also be covered with layers of dielectric material and polished using the method of the invention. The lower dielectric layer 42 is preferably made from undoped silicon nitride, and it is deposited at a constant thickness "t" on the top surfaces 37 of the conducting lines 38. In a preferred embodiment, the lower layer 42 is deposited directly onto the conducting lines 38. Additionally, the lower layer 42 does not completely fill the channels 39 such that a number of indentations 44 are formed between adjacent conducting lines 38. Importantly, the indentations 44 extend below the top surfaces 37 of the conducting lines 38. An upper layer of dielectric material 60 is then deposited on the lower layer 42. The upper dielectric layer 60 has a higher polishing rate than the lower layer 42, and it is deposited on the lower layer 42 so that it fills the indentations 44 to a point that is above the top surfaces 45 of the lower layer 42.

The upper layer of dielectric material 60 may be made from several materials including undoped or doped silicon dioxide. The upper dielectric layer 60 is desirably made from a material that is selectively etchable from the lower layer 42, and has a polishing rate that is between 200% and 1500% greater than that of the lower layer. In the case of a doped silicon dioxide layer over a layer of silicon nitride, the dopant concentration in the silicon dioxide may decrease with increasing depth as discussed above with respect to the dielectric layer 46 in FIG. 5A, or it may be constant throughout the layer of silicon dioxide.

Referring to FIG. 8B, the CMP process removes the upper dielectric layer 60 at a relatively rapid rate. The CMP process continues until the top surfaces 45 of the lower layer 42 are exposed such that the surface of the wafer alternates between the top surfaces 45 of the lower layer 42 and the portion of the upper layer 60 in the indentations 44. For the reasons discussed above, the lower layer 42 acts as a polishing stop on top of the conducting lines 38 to form a highly planar dielectric layer across the wafer.

Figure 8C:
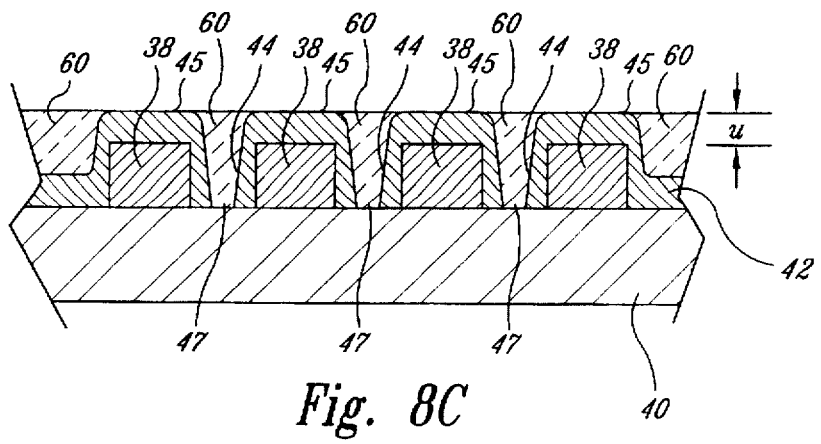
FIG. 8C is a schematic cross-sectional view of a semiconductor structure illustrating an embodiment of the invention.

FIG. 8C illustrates another embodiment of the invention in which a gap 47 is formed into the lower dielectric layer 42 at each indentation 44. The gaps 47 extend through the lower layer 42 to the substrate 40, and they are formed by dry-etching the lower layer 42 before the upper layer 60 is deposited over the lower layer. The upper layer 60 fills the gaps 47, thus providing a single material between the conducting lines 38 that extends to the substrate 40 and is selectively etchable from the lower layer 42 over the conducting lines 38. Therefore, after the dielectric layers 42 and 60 have been planarized by the CMP process, a direct path to the substrate 40 may be etched in the remaining portions of the upper layer 60 without having to precisely locate the channels 39 or protect the planarized surface with a photoresist material.

One advantage of the present invention is that it provides an endpointing technique that forms a highly planar dielectric layer on a wafer without necessarily making the upper dielectric layer from a doped material. By forming the lower dielectric layer 42 from silicon nitride, the upper layer 60 may be made from undoped silicon dioxide because the polishing rate of undoped silicon dioxide is approximately 200% to 500% greater than that of undoped silicon nitride. The layer of silicon nitride causes the polishing rate to significantly decrease once all of the high points of the upper dielectric layer 60 have been removed to a level that corresponds to the top surfaces 45 of the silicon nitride layer 42. The polishing machine readily indicates such a significant drop in the polishing rate, which allows the operator to stop the polishing process within the undoped layer of silicon nitride at a point near its top surfaces 45. Referring to FIG. 8B, the polishing process is stopped within the layer of silicon nitride at a point near its top surfaces 45 such that the resulting layer of silicon nitride 42 has a thickness "u" that is only slightly less than the thickness "t".

Another advantage of the present invention is that it generally enhances the integrity of a wafer because it eliminates many of the non-uniformities in subsequent layers. Unlike conventional endpointing techniques where many other layers of materials are deposited over the features before a dielectric layer is planarized by the CMP process, the present invention deposits the lower dielectric layer directly onto the conducting lines, and then deposits the upper dielectric layer onto the lower layer. The CMP process is performed on the dielectric layers to form a highly planar surface at an early stage of the fabrication of the wafer. By depositing the dielectric layers on top of the conducting lines instead of on a series of blanket layers that conform to the underlying topography of the conducting lines, the present invention avoids having to CMP all of the compounding non-uniformities of the underlying blanket layers. Moreover, by forming the subsequent blanket layers on a uniform planar surface, the blanket layers may be formed more uniformly and with less material than when they are formed over an uneven surface.

Still another advantage of the present invention is that it provides a surface which may be easily processed to use the space between the conducting lines 38. Unlike conventional endpointing processes that completely fill the channels 39 between the conducting lines with a single type of material, the present invention creates elongated indentations 44 between the conducting lines 38 and fills the indentations 44 with the material of the second dielectric layer 60. The lower layer 42 may be etched in the indentations 44 to form gaps 47 that extend to the top surface of the substrate 40. In a preferred embodiment, the first and second dielectric layers 42 and 60 are selectively etchable so that the material in the indentations 44 and/or the gaps 47 may be selectively etched either without masking and photo-patterning the dielectric layer, or with a photomask to obtain greater alignment tolerances.

Thus the invention provides an improved method of CMP and an improved method for planarizing interlevel dielectric layers. While the method of the invention has been described with reference to certain preferred embodiments, as will be apparent to those skilled in the art, certain changes and modifications can be made without departing from the scope of the invention as defined by the following claims.

I claim:

1. A chemical mechanical polishing method for forming a planarized dielectric layer on a substrate, comprising the steps of:

depositing an undoped dielectric layer of silicon nitride on the substrate;

depositing a doped dielectric layer on the undoped silicon nitride layer;

controlling a dopant concentration of the doped dielectric layer to produce a dopant concentration profile with the dopant concentration decreasing with increasing depth into the doped dielectric layer and then leveling to a substantially uniform concentration;

polishing the doped dielectric layer using a chemical mechanical polishing process;

controlling a polish rate of the chemical mechanical polishing process using the dopant concentration such that the polish rate decreases with increasing depth into the doped dielectric layer; and end pointing the polishing process at a planar endpoint located within the undoped layer of silicon nitride.

2. The method of claim 1 wherein the depositing step of the undoped silicon nitride layer comprises forming the silicon nitride layer at a constant thickness across the substrate.

3. The method of claim 1 wherein the endpointing step comprises stopping the polishing process within the undoped layer of silicon nitride at a point near the original surface of the silicon nitride layer.

4. The method of claim 1, further comprising the step of removing a portion of the silicon nitride layer between conducting lines to form a gap between conducting lines extending to the substrate.

5. A chemical mechanical polishing method for forming a planarized dielectric layer over an array of spaced apart conducting lines on a substrate, comprising the steps of:

depositing a first dielectric layer on the conducting lines and on the substrate, the first layer having a relatively low polishing rate and a substantially constant thickness across the conducting lines and the substrate, wherein the first layer forms indentations between top surfaces of adjacent conducting lines;

forming gaps in the indentations of the first layer that extend through the first layer to an underlying surface;

depositing a second dielectric layer on the first layer so that the second layer fills the gaps and the indentations, and so that the second layer extends above the first layer, the second layer having a higher polishing rate than the first layer and being selectively etchable from the first layer;

polishing the second layer using a chemical mechanical polishing process; and endpointing the polishing process at a planar endpoint when the first layer is exposed across the top surfaces of the conducting lines to form a self-aligned pattern between the conducting lines from material of the second layer that extends from the planarized surface to the underlying surface.

6. The method of claim 5 wherein the first layer is made from silicon nitride and the second layer is made from undoped silicon dioxide.

7. The method of claim 5 wherein the first layer is made from silicon nitride and the second layer is made from doped silicon dioxide.

8. A chemical mechanical polishing method for forming a planarized dielectric layer over an array of spaced-apart conducting lines on a substrate, comprising the steps of:

depositing a silicon nitride layer on the conducting lines and on the substrate, the silicon nitride layer having a substantially constant thickness across the conducting lines and the substrate, wherein the silicon nitride layer forms indentations between top surfaces of adjacent conducting lines;

depositing a doped silicon dioxide layer on the silicon nitride layer so that the doped silicon oxide layer fills the indentations and extends above the silicon nitride layer, the doped silicon oxide layer having a higher polishing rate than the silicon nitride layer and being selectively etchable from the silicon nitride layer;

controlling a dopant concentration of the second layer to produce a dopant concentration profile within the second layer that decreases with increasing depth into the second layer and then levels to a substantially uniform concentration;

controlling a polish rate of the chemical mechanical polishing process using the dopant concentration of the second layer such that the polish rate decreases with increasing depth into the second layer; and endpointing the polishing process at a planar endpoint.

9. The method of claim 5 wherein the first layer is undoped silicon nitride and the endpointing step comprising stopping the polishing process when the undoped layer of silicon nitride is uniformly exposed across the top surfaces of the conducting lines.

10. The method of claim 5 wherein the second dielectric layer is made from a material that has a polishing rate that is from 200% to 1500% greater than that of a first layer of silicon nitride under similar pressure, temperature, and slurry conditions.

11. The method of claim 9 wherein the second layer is silicon oxide that is doped with a material selected from the group consisting of boron, phosphorus, arsenic, and germanium.

12. The method of claim 5, further comprising the step of removing a portion of the first dielectric layer between the conducting lines to form a gap between the conducting lines extending to the substrate.

* * * * *